(12) United States Patent
Sagawa et al.

(10) Patent No.: US 11,842,880 B2
(45) Date of Patent: Dec. 12, 2023

(54) ESTIMATION MODEL GENERATION METHOD AND ELECTRON MICROSCOPE

(71) Applicant: JEOL Ltd., Tokyo (JP)

(72) Inventors: Ryusuke Sagawa, Tokyo (JP);
Shigeyuki Morishita, Tokyo (JP);
Fuminori Uematsu, Tokyo (JP);
Tomohiro Nakamichi, Tokyo (JP);
Keito Aibara, Tokyo (JP)

(73) Assignee: JEOL Ltd., Tokyo (JP)

( * ) Notice: Subject to any disclaimer, the term of this patent is extended or adjusted under 35 U.S.C. 154(b) by 55 days.

(21) Appl. No.: 17/671,896

(22) Filed: Feb. 15, 2022

(65) Prior Publication Data
US 2022/0262595 A1   Aug. 18, 2022

(30) Foreign Application Priority Data
Feb. 16, 2021 (JP) .................. 2021-022197

(51) Int. Cl.
*H01J 37/153* (2006.01)
*H01J 37/26* (2006.01)
*H01J 37/28* (2006.01)

(52) U.S. Cl.
CPC ........ *H01J 37/153* (2013.01); *H01J 37/265* (2013.01); *H01J 37/28* (2013.01); *H01J 2237/1534* (2013.01); *H01J 2237/2487* (2013.01); *H01J 2237/2802* (2013.01)

(58) Field of Classification Search
CPC ........ H01J 37/00; H01J 37/02; H01J 37/153; H01J 37/265; H01J 37/26; H01J 37/28; H01J 37/222; H01J 2237/1534; H01J 2237/2487; H01J 2237/2802; H01J 2237/22

USPC .................................. 250/306, 307, 311
See application file for complete search history.

(56) References Cited

U.S. PATENT DOCUMENTS

| | | | |
|---|---|---|---|
| 2007/0120055 A1 | 5/2007 | Sawada et al. | |
| 2007/0125945 A1* | 6/2007 | van der Zande | H01J 37/153 250/307 |
| 2009/0082993 A1* | 3/2009 | Li | G01B 11/0625 702/155 |

FOREIGN PATENT DOCUMENTS

| | | |
|---|---|---|
| JP | 2006173027 A | 6/2006 |
| JP | 2007180013 A | 7/2007 |

OTHER PUBLICATIONS

Schnitzer et al., Maximal Resolution from the Ronchigram: Huamn vs. Deep Learning, 2019, Microsc. Microanal. 25 (Suppl 2), pp. 160-161. (Year: 2019).*
Extended European Search Report issued in EP22155957.8 dated Jul. 8, 2022.
Schnitzer et al., Maximal Resolution from the Ronchigram: Human vs. Deep Learning, Microscopy and Microanalysis, vol. 25, No. S2, 2019, pp. 160-161.

(Continued)

*Primary Examiner* — Jason L McCormack
(74) *Attorney, Agent, or Firm* — THE WEBB LAW FIRM

(57) ABSTRACT

An aberration value estimator has a learned estimation model for estimating an aberration value set based on a Ronchigram. In a machine learning sub-system, a simulation is repeatedly executed while changing a simulation condition, and calculated Ronchigrams are generated in a wide variety and in a large number. By machine learning using the calculated Ronchigrams, the learned estimation model is generated.

8 Claims, 10 Drawing Sheets

(56) References Cited

OTHER PUBLICATIONS

Schnitzer et al., Optimal STEM Convergence Angle Selection using a Convolutional Neural Network and the Strehl Ratio, Cornell University Library, Jul. 24, 2020, pp. 1-28.
Schnitzer et al., Introduction to the Ronchigram and its Calculation with Ronchigram.com, Microscopy Today, vol. 27, No. 3, May 2019, pp. 12-15.
Haider et al., Present and Future Hexapole Aberration Correctors for High-Resolution Electron Microscopy, Advances in Imaging and Electron Physics, vol. 153, ISSN 1076-5670, 2008, pp. 43-119.

* cited by examiner

ESTIMATION MODEL GENERATION METHOD AND ELECTRON MICROSCOPE

CROSS REFERENCE TO RELATED APPLICATION

This application claims priority to Japanese Patent Application No. 2021-022197 filed Feb. 16, 2021, the disclosure of which is hereby incorporated by reference in its entirety.

BACKGROUND OF THE INVENTION

Field of the Invention

The present disclosure relates to a method of generating an estimation model and to an electron microscope, and in particular to a technique for correcting aberration caused in an electron microscope.

Description of Related Art

In electron microscopes, in particular, in scanning transmission electron microscopes (STEM) having a high spatial resolution, aberration correction is necessary in order to sufficiently narrow a focus of an electron beam (electron probe).

As aberrations caused in the electron microscope, there are known a spherical aberration, an astigmatism, a coma aberration, a three-lobe aberration, and the like. More specifically, as the spherical aberration, there are known a third-order spherical aberration, a fifth-order spherical aberration, and the like. As the astigmatism, there are known a two-fold astigmatism (which is a first-order astigmatism from a viewpoint of a geometrical aberration, and a second-order astigmatism from a viewpoint of a wave aberration), a three-fold astigmatism (which is a second-order astigmatism from the viewpoint of the geometrical aberration, and a third-order astigmatism from the viewpoint of the wave aberration), and the like.

"Two-fold" described above means "two-fold symmetry", and "three-fold" means "three-fold symmetry". "n-fold" symmetry means that, when a certain geographical figure is rotated by (360/n) degrees, a geometrical figure after the rotation overlaps the geometrical figure before the rotation.

In the scanning transmission electron microscopes, normally, an aberration corrector is provided. The aberration corrector includes, for example, a plurality of multipoles and a plurality of transfer lenses. Each individual multipole is, for example, a dodeca-pole. With the dodeca-pole, a three-fold symmetry field is formed.

For the aberration correction, normally, a Ronchigram is acquired. The Ronchigram is a projected image generated by illuminating an electron beam to a region having a random atomic arrangement without any regularity (more specifically, an amorphous region). On the Ronchigram, a pattern appears which reflects various aberrations caused in an electron beam illumination system (in particular, an objective lens).

For control of operations of the aberration corrector, the Ronchigram is analyzed, and an aberration value set (array or matrix) is calculated. Based on the aberration value set, excitation currents to be supplied to the aberration corrector are controlled. JP 2007-180013 A (Patent Document 1) discloses an SRAM (Segmented Ronchigram Auto-correlation function Matrix) method for calculating the aberration values. In the SRAM method, for example, a first Ronchigram acquired under an under-focus condition and a second Ronchigram acquired under an over-focus condition are analyzed. For each Ronchigram, a plurality of regions are set in a grid shape, and an auto-correlation function is calculated for each region. The aberration values are calculated based on a plurality of the auto-correlation functions calculated based on the first Ronchigram and a plurality of the auto-correlation functions calculated based on the second Ronchigram.

JP 2006-173027 A (Patent Document 2) discloses another method of determining an aberration value based on the Ronchigram. Patent Documents 1 and 2 do not disclose generation of an estimation model for estimating the aberration values or a use of the estimation model.

The content of the Ronchigram significantly varies depending on a content of the aberration actually caused in the illumination system, and significantly varies depending on an amount of defocus, an illumination center position, a magnification, or the like. Precise estimation of one or a plurality of aberration values based on the Ronchigram is desired, presuming a variety of Ronchigrams.

An advantage of the present disclosure lies in improving estimation precision when one or a plurality of aberration values are estimated based on a Ronchigram. Alternatively, an advantage of the present disclosure lies in generation of an estimation model which enables precise estimation of one or a plurality of aberration values based on a Ronchigram.

SUMMARY OF THE INVENTION

According to one aspect of the present disclosure, there is provided a method of generating an estimation model, the method comprising: generating a plurality of calculated Ronchigrams by repeatedly executing a simulation while changing a simulation condition; improving an estimation model in a learner by sequentially supplying, to the learner, a plurality of sets of training data formed from the plurality of calculated Ronchigrams and a plurality of sets of correct answer data corresponding to the plurality of calculated Ronchigrams, wherein the estimation model is a model for estimating one or a plurality of aberration values which are referred to in aberration correction in an electron microscope, and each set of correct answer data is data indicating one or a plurality of hypothetical aberration values included in each simulation condition.

According to another aspect of the present disclosure, there is provided an electron microscope comprising: an illuminator that has an aberration corrector and that illuminates an electron beam onto a sample; a generator that generates an actual Ronchigram by detecting electrons transmitting through the sample; an estimator that has a learned estimation model for estimating one or a plurality of aberration values based on the actual Ronchigram, that receives an input of the actual Ronchigram, and that outputs the one or plurality of aberration values; and a controller that controls an operation of the aberration corrector based on the one or plurality of aberration values.

BRIEF DESCRIPTION OF DRAWINGS

Embodiment(s) of the present disclosure will be described based on the following figures, wherein.

DESCRIPTION OF THE INVENTION

Figure 1:
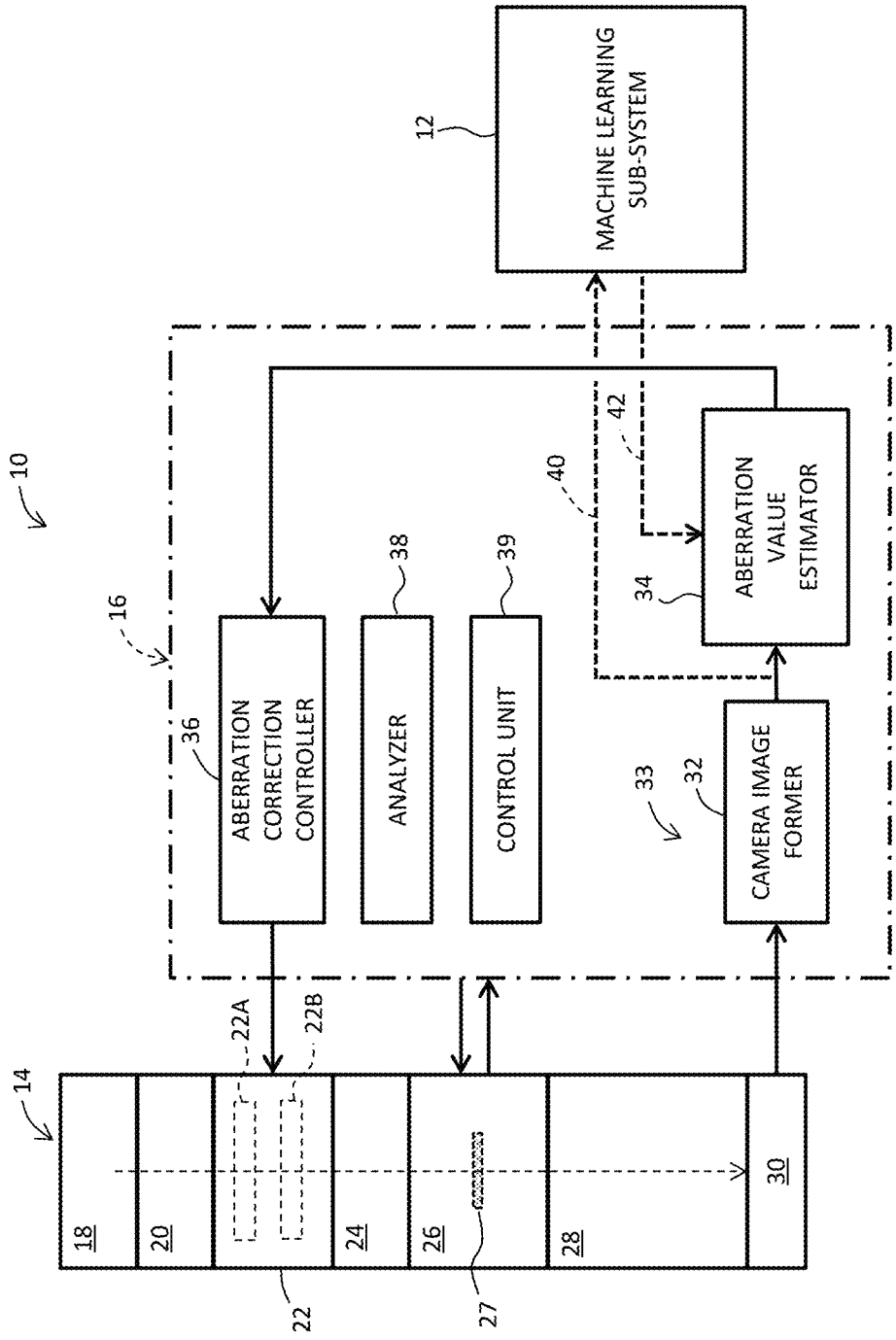
FIG. 1 is a block diagram showing an electron microscope system according to an embodiment of the present disclosure.

An embodiment of the present disclosure will now be described with reference to the drawings.

(1) Overview of Embodiment

A machine learning method according to an embodiment of the present disclosure comprises a simulation process and a learning process. In the simulation process, a plurality of calculated Ronchigrams are generated by repeatedly executing a simulation while changing a simulation condition. In the learning process, an estimation model in a learner is improved by sequentially supplying a plurality of sets of training data to the learner. Each set of training data is formed from the calculated Ronchigram and correct answer data corresponding to the calculated Ronchigram. The estimation model is a model for estimating one or a plurality of aberration values which are referred to in aberration correction in an electron microscope. Each set of correct answer data is data indicating one or a plurality of hypothetical aberration values included in each simulation condition.

According to the configuration described above, with the simulation, calculated Ronchigrams may be easily generated in a wide variety and in a large number, and machine learning can be applied in the learner using the large number of calculated Ronchigrams. As a consequence, an estimation model which is highly reliable and which can correspond to various Ronchigrams can be generated. Because each simulation condition includes the correct answer data, no special work or special calculation is necessary when preparing the correct answer data.

With the estimation model, one aberration value may be estimated from one actual Ronchigram, or a plurality of aberration values may be simultaneously estimated from one actual Ronchigram. Each aberration value is a scalar value or a vector value. Alternatively, one or a plurality of aberration values may be estimated from a plurality of actual Ronchigrams. The calculated Ronchigram is a Ronchigram generated by the simulation; that is, calculation. The actual Ronchigram is a Ronchigram actually acquired by the electron microscope.

In an embodiment of the present disclosure, each simulation condition includes a hypothetical aberration value set, a hypothetical amount of defocus, a hypothetical illumination center position, and a hypothetical magnification. Each simulation condition is formed from a large number of parameters simulating illumination of an electron beam onto a sample and transmission of the electron beam through the sample, in an actual electron microscope. The simulation condition may further include a hypothetical accelerating voltage or the like.

The machine learning method according to an embodiment of the present disclosure further comprises a preparation process in which a particular aberration value is estimated in advance based on an actual Ronchigram. In the simulation process, the simulation is executed based on a hypothetical aberration value set including the particular aberration value.

For example, when the hypothetical aberration value set included in the simulation condition includes a hypothetical aberration value which significantly affects a simulation result, this aberration value is handled as the particular aberration value. That is, the aberration value is specified in advance in the preparation process. By executing the simulation based on the simulation condition including the particular aberration value, it becomes possible to form the calculated Ronchigram which is closer to the actual Ronchigram.

In an embodiment of the present disclosure, the particular aberration value is an aberration value for a particular aberration which occurs due to an aberration corrector of the electron microscope, and which cannot be corrected by the aberration corrector. Specifically, the particular aberration is an aberration of an order which is higher than those of one or a plurality of aberrations which are estimation targets. Such an aberration may also be referred to as an aberration intrinsic to the illumination system, or an intrinsic aberration.

Experiments and research conducted by the present inventors have revealed that, although the intrinsic aberration is not an estimation target, the intrinsic aberration value significantly affects the simulation result (and, consequently, one or a plurality of aberration values which are estimated), Specifically, in the setting of the simulation condition, if the expected and determined intrinsic aberration value is deviated from the actual aberration value, precision of the calculated Ronchigram generated by the simulation tends to be reduced. Thus, in the above-described configuration, the intrinsic aberration value is accurately estimated in advance, and the intrinsic aberration value thus estimated is incorporated in the simulation condition. For example, when an aberration corrector having a dodeca-pole is used, for example, a six-fold astigmatism and a sixth-order three-lobe aberration respectively correspond to the intrinsic aberrations.

In an embodiment of the present disclosure, the preparation process includes an in-advance simulation process, an in-advance learning process, and an in-advance estimation process. In the in-advance simulation process, a plurality of calculated Ronchigrams are generated by repeatedly executing an in-advance simulation while changing an in-advance simulation condition. In the in-advance learning process, an in-advance estimation model in an in-advance learner is improved by sequentially supplying, to the in-advance learner, a plurality of sets of in-advance training data. Each set of in-advance training data is formed from the calculated Ronchigram generated in the in-advance simulation process, and correct answer data corresponding to the calculated Ronchigram. In the in-advance estimation process, the particular aberration value is estimated by supplying the actual Ronchigram to an in-advance estimator having the in-advance estimation model. Each set of correct answer data in each set of in-advance training data is data indicating a hypothetical intrinsic aberration value included in each in-advance simulation condition.

In the above-described configuration, the in-advance estimation model is generated by the in-advance learning, the intrinsic aberration value is estimated using the in-advance estimation model, and the intrinsic aberration value thus estimated is included in the simulation condition. With this configuration, the estimation model can be further improved, and the estimation model can consequently be further improved.

The machine learning method according to an embodiment of the present disclosure further includes a process to apply a post-processing on the plurality of calculated Ronchigrams generated in the simulation process. Each set of training data includes each calculated Ronchigram to which the post-processing is applied.

In an embodiment of the present disclosure, the post-processing includes a masking process to cover a periphery of each of the calculated Ronchigrams while exposing a center portion. In the actual Ronchigram, in many cases, the peripheral portion is missing due to an action of a focusing diaphragm. Accordingly, the peripheral portion is masked in the calculated Ronchigram. With the masking, it becomes more difficult for an anisotropy to be caused in the estimation model. The concept of the masking process includes a center-portion cut-out process or the like.

An electron microscope according to an embodiment of the present disclosure comprises: an illuminator; a generator; an estimator; and a controller. The illuminator has an aberration corrector, and illuminates an electron beam onto a sample. The generator generates an actual Ronchigram by detecting electrons transmitting through the sample. The estimator has a learned estimation model for estimating one or a plurality of aberration values based on an actual Ronchigram, receives an input of the actual Ronchigram, and outputs the one or a plurality of aberration values. The controller controls an operation of the aberration corrector based on the one or plurality of aberration values.

In general, when a rule-based method of estimating the aberration value is employed, calculation precision of the aberration value set varies significantly depending on various conditions such as the amount of defocus, the illumination center position, the magnification, and the like. Alternatively, the calculation precision may be reduced only for a particular aberration value. In contrast, according to the above-described configuration, because various calculated Ronchigrams are supplied to the estimation model during the learning step, there can be constructed a learned estimation model which is not easily affected by the above-described conditions.

In an embodiment of the present disclosure, the learned estimation model is a model generated by machine learning using a plurality of calculated Ronchigrams acquired by repeatedly executing a simulation while changing a simulation condition. In an embodiment of the present disclosure, each simulation condition includes a hypothetical aberration value set, a hypothetical amount of defocus, a hypothetical illumination center position, and a hypothetical magnification.

As the Ronchigram for learning, the actual Ronchigram may be used, but in reality, it is difficult to prepare actual Ronchigrams in a wide variety and in a large number. Thus, in the above-described configuration, a large number of calculated Ronchigrams of a wide variety are generated by the simulation, and are supplied to the estimation model.

The electron microscope according to an embodiment of the present disclosure further comprises a calculator. The calculator calculates one or a plurality of first aberration values by analyzing an electron microscope image through a predetermined algorithm (for example, a plurality of actual Ronchigrams acquired while varying the amount of defocus). The estimator estimates one or a plurality of second aberration values based on the actual Ronchigram. The controller controls the operation of the aberration corrector based on an aberration value set including the one or plurality of first aberration values and the one or plurality of second aberration values.

The calculator executes a rule-based method of estimating the aberration value according to a predetermined algorithm, to estimate the first aberration value. In addition, the estimator estimates the second aberration value by the estimation model generated by the machine learning. By combing the two estimation methods having different properties, the aberration value set to be supplied to the aberration corrector can be further improved. The calculator is, for example, a calculator which executes the SRAM method as described above. Alternatively, other calculators may be provided as the calculator.

(2) Details of Embodiment

FIG. 1 shows an electron microscope system according to an embodiment of the present disclosure. The electron microscope system is formed from an electron microscope 10 and a machine learning sub-system 12. The machine learning sub-system 12 generates, in advance, an estimation model (learned estimation model) to be incorporated in the electron microscope 10. Alternatively, the machine learning sub-system 12 may be shared by a plurality of electron microscopes 10.

The electron microscope 10 is, for example, a scanning transmission electron microscope (STEM) having a high resolution. The electron microscope 10 is formed from a measurement apparatus 14 and a calculation control apparatus 16. The measurement apparatus 14 corresponds to a main body of the electron microscope.

The measurement apparatus 14 comprises an electron gun 18, a focusing lens 20, an aberration corrector 22, a deflection scanner 24, an objective lens 26, an imaging system 28, and a camera 30, which are arranged on an optical axis. An electron beam is generated by the electron gun 18, and passes through the aberration corrector 22 via the focusing lens 20. The focusing lens 20 includes an aperture (a diaphragm).

The aberration corrector 22 realizes a function to cancel a plurality of aberrations, primarily caused in the objective lens 26. Ideally, aberration correction is executed so that the electron beam is focused at one point at a focal point on a sample 27. The aberration corrector 22 has a plurality of elements arranged on the optical axis, including a plurality of multipoles and a plurality of transfer lenses. In the present embodiment, two dodeca-poles 22A and 22B are provided in the aberration corrector 22. Each of the dodeca-poles 22A and 22B generates a three-fold symmetry field.

Aberrations that can be corrected by the aberration corrector 22 (that is, aberrations which are targets of estimation of the aberration value) include a two-fold astigmatism, a coma aberration on a second-order axis, a three-fold astigmatism, a third-order spherical aberration, a third-order star aberration, a four-fold astigmatism, a coma aberration on a fourth-order axis, a fourth-order three-lobe aberration, a five-fold astigmatism, a fifth-order spherical aberration, and the like (the orders are orders as viewed from the viewpoint of the geometric aberration).

The aberration corrector 22 itself causes an aberration. As such an aberration, there may be exemplified a six-fold astigmatism, a sixth-order three-lobe aberration, and the like. In a situation in which the three-fold astigmatism, the third-order spherical aberration, and the like are sufficiently reduced, higher order aberrations such as the six-fold astigmatism, the sixth-order three-lobe aberration, and the like appear as residual aberrations. These aberrations are intrinsic aberrations which cannot be corrected by the aberration corrector 22, and are aberrations of higher orders than a plurality of aberrations which can be corrected by the aberration corrector 22. The contents of the aberrations which can be corrected and the intrinsic aberrations may vary according to a structure of the aberration corrector 22.

The sample 27 is placed in the objective lens 26. In the illustrated configuration, the objective lens 26 forms a magnetic field at a front side and a deeper side of the sample 27. The sample 27 is held by a holding apparatus, but illustration of the holding apparatus is omitted. For the acquisition of the actual Ronchigram, an electron beam is illuminated to an amorphous portion of the sample 27. Alternatively, an amorphous portion may be provided on a member holding the sample 27 (for example, a grid), and the electron beam may be illuminated onto this amorphous portion.

The imaging system 28 includes an intermediate lens, a projection lens, or the like. The camera 30 is, for example, a CCD camera, and detects electrons transmitting through the sample 27. A plurality of detectors are provided between the objective lens 26 and the camera 30, but illustration of these detectors is omitted. Based on output signals from the detectors, a two-dimensional image of the sample 27 is generated, or analysis of the sample 27 is executed. The structure from the electron gun 18 to the objective lens 26 corresponds to an illuminator which functions as an illuminating unit or an illuminating means.

The calculation control apparatus 16 is formed from a computer serving as an information processing apparatus. The calculation control apparatus 16 includes a processor which executes a program. The processor is, for example, a CPU. In FIG. 1, a plurality of functions executed by the processor are represented by a plurality of blocks.

A camera image former 32 forms a camera image based on an output signal from the camera 30. Alternatively, the camera image former 32 may function as a camera controller. When the electron beam is illuminated onto the amorphous region, an actual Ronchigram is acquired as the camera image. The camera 30 and the camera image former 32 form a Ronchigram generator 33 serving as a generator.

An aberration value estimator 34 is an estimator which functions as an aberration value estimating unit or an aberration value estimating means. The aberration value estimator 34 is a machine learning-type estimator, and is formed from a CNN (Convolutional Neural Network). Alternatively, an estimator of other machine learning type may be used. The aberration value estimator 34 includes a learned estimated model. The learned estimation model is generated in advance by the machine learning sub-system 12. Reference numeral 42 shows installation of the learned estimation model. A substance of the learned estimation model is a parameter set necessary for causing the CNN to function.

In the illustrated example configuration, when the actual Ronchigram is input to the aberration value estimator 34, the aberration value estimator 34 outputs an aberration value set. The aberration value set is formed from a plurality of aberration values. The aberration value set does not include an aberration value for the intrinsic aberration which is not a correction target. In the present embodiment, intrinsic aberrations of interest are the six-fold astigmatism, and the sixth-order three-lobe aberration. In other words, the aberration value set which is estimated does not include an aberration value of the six-fold astigmatism (hereinafter referred to as "aberration value A6"), and an aberration value of the sixth-order three-lobe aberration (hereinafter referred to as "aberration value R7") (the orders included in A6 and R7 are orders from the viewpoint of the wave aberration).

In the present embodiment, in the machine learning at the machine learning sub-system 12, the actual Ronchigram is used. More specifically, in a preparation process, the actual Ronchigram is used for estimating the aberration value A6 and the aberration value R7. The aberration value A6 and the aberration value R7 are vectors. Reference numeral 40 shows transfer of the actual Ronchigram.

An aberration correction controller 36 is a controller which controls an operation of the aberration corrector 22 based on the aberration value set which is estimated. In reality, the aberration correction controller 36 adjusts current values of a plurality of excitation currents supplied to the aberration corrector 22. The aberration correction based on the Ronchigram is repeatedly executed, and, finally, the aberration correction is completed. After the aberration correction, observation and analysis of the sample are executed. The calculation control apparatus 16 comprises an analyzer 38 which executes analysis based on a detection signal, and a control unit 39 which controls an overall operation of the electron microscope itself.

The machine learning sub-system 12 is a sub-system which generates the learned estimation model. The machine learning sub-system 12 is formed from a computer having a processor which executes a program. At the time of manufacture or at the time of maintenance of the electron microscope 10, the learned estimation model is installed in the aberration value estimator 34. Alternatively, the learned estimation model may be installed from a server on a network to the aberration value estimator 34. Alternatively, a re-learning of the learned estimation model may be executed during a course of use of the electron microscope 10.

Figure 2:
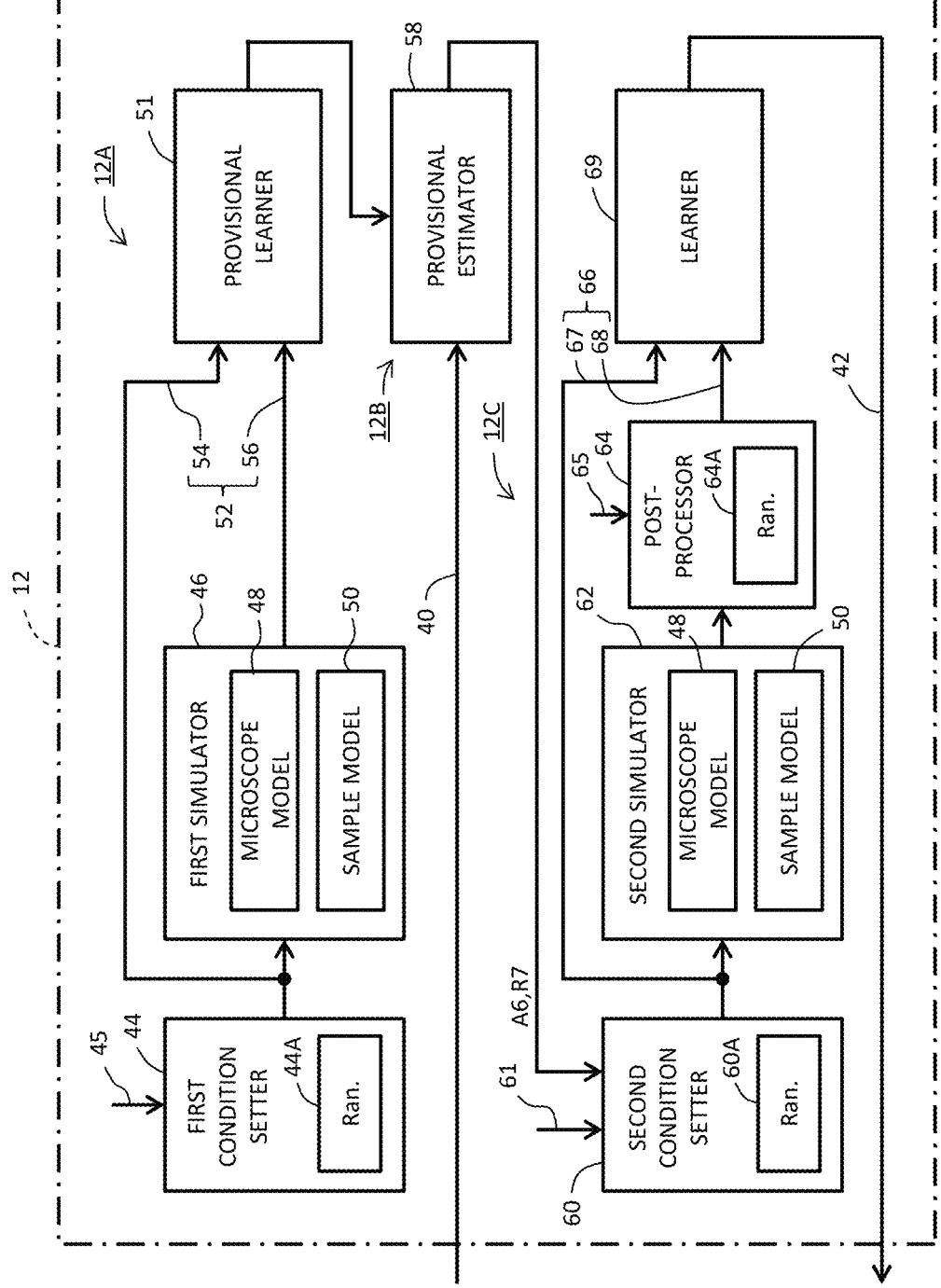
FIG. 2 is a block diagram showing an example structure of a machine learning sub-system.

With reference to FIGS. 2 to 5, the machine learning sub-system 12 will now be described in detail. FIG. 2 shows an example structure of the machine learning sub-system. A plurality of blocks shown in FIG. 2 correspond to a plurality of functions realized by the processor. The machine learning sub-system 12 can roughly be formed from a first module 12A, a second module 12B, and a third module 12C.

The first module 12A generates an estimation model (provisional model) for estimating a group of intrinsic aberration values prior to generation of a learned model (actual model) for estimating the aberration value set. The first model 12A executes an in-advance simulation process and an in-advance learning process, simultaneously and in parallel to each other. In the present embodiment, the group of intrinsic aberration values is formed from the aberration value A6 and the aberration value R7. Alternatively, the in-advance simulation process and the in-advance learning process may be executed not simultaneously with each other. For example, when the in-advance simulation process requires a long time, the in-advance simulation process may be executed prior to the in-advance learning process.

The second module 12B estimates a group of actual intrinsic aberration values from the actual Ronchigram using the learned provisional model. The second module 12B executes an in-advance estimation process.

The third module 12C generates an estimation model (actual model) for estimating the aberration value set. The third module 12C executed the simulation process and the learning process, simultaneously and in parallel to each other. The generated learned actual model is transferred from the machine learning sub-system to the electron microscope (refer to reference numeral 42). Alternatively, the simulation process and the learning process may be executed not simultaneously with each other. For example, when the simulation process requires a long time, the simulation process may be executed prior to the learning process.

The structures of the modules 12A, 12B, and 12C will now be described in detail. The first module 12A comprises a first condition setter 44, a first simulator 46, and a provisional learner 51.

The first condition setter 44 sets an in-advance simulation condition. In this process, a part of the in-advance simulation condition is generated at random. More specifically, using a random number generator 44A, a hypothetical aberration value A6 and a hypothetical aberration value R7 are generated at random. Generation ranges for these aberration values are designated in advance (refer to reference numeral 45).

In the in-advance simulation condition, for parameters other than the hypothetical aberration value A6 and the hypothetical aberration value R7, fixed values are assigned. The fixed value is, for example, 0, a standard value, or an actually measured value. Alternatively, an amount of defocus, an illumination center position, or the like when the actual Ronchigram to be input to a provisional estimator 58 to be described later is acquired may be identified, and included in the in-advance simulation condition. The in-advance simulation condition will be described in detail later with reference to FIG. 3.

The first simulator 46 has a microscope model 48 and a sample model 50. The microscope model 48 mathematically models an operation of the electron microscope, and the sample model 50 mathematically models the sample (amorphous region). The first simulator 46 executes a simulation based on the microscope model 48 and the sample model 50 according to the in-advance simulation condition, to thereby generate the calculated Ronchigram. In reality, the first simulator 46 sequentially generates a plurality of calculated Ronchigrams according to a plurality of sets of in-advance simulation conditions which are sequentially input. Alternatively, one or a plurality of parameters included in the sample model 50 may be set at random.

The provisional learner 51 is formed from the CNN. Alternatively, other types of learners may be used. The provisional learner 51 includes an estimation model, and the machine learning progresses according to a plurality of sets of training data 52 which are sequentially input. With the progress of the machine learning, the estimation model is gradually improved. Each individual set of training data 52 is formed from a group of intrinsic aberration values (the aberration value A6 and the aberration value R7) 54 included in the in-advance simulation condition, and a calculated Ronchigram 56 generated based on the in-advance simulation condition. From the viewpoint of the machine learning, the aberration value A6 and the aberration value R7 are a group of correct answer aberration values, and the data thereof are the correct answer data.

When the calculated Ronchigram is supplied to the estimation model, the estimation model is updated such that an estimation result of the estimation model becomes closer to the correct answer data. By repeating this process, the estimation model is gradually improved. Finally, a learned estimation model (provisional model) for estimating the aberration value A6 and the aberration value R7 is generated in the provisional learner 51.

The second module 12B has a provisional estimator 58. The provisional estimator 58 includes the learned estimation model generated in the manner described above. In reality, the provisional learner 51 and the provisional estimator 58 are identical to each other in substance, but in FIG. 2, in order to distinguish the learning step and the estimation step, the provisional learner 51 and the provisional estimator 58 are represented separately. When the actual Ronchigram 40 acquired using the electron microscope is supplied to the provisional learner 58, the actual aberration value A6 and the actual aberration value R7 are estimated. These aberration values are provided to a second condition setter 60.

The third module 12C includes the second condition setter 60, a second simulator 62, a post-processor 64, and a learner 69. The second condition setter 60 repeatedly generates the simulation condition. In this process, many parameters are generated at random. For this purpose, a random number generator 60A is used. In the simulation condition, parameters which are fixedly set are the aberration value A6 and the aberration value R7. These aberration values are intrinsic aberration values.

A generation range of each individual parameter is designated in advance (refer to reference numeral 61). For example, a large number of amounts of defocus actually occurring in the electron microscope may be referred to, an average value and a spreading range may be determined based thereon, and a random generation range of the amount of defocus may be determined based on the average value and the spreading range. Similarly, for the other parameters, the random generation ranges may be determined based on a plurality of values which were actually observed. The simulation condition which is set by the second condition setter 60 will be described in detail later with reference to FIG. 4.

Similar to the first simulator 46, the second simulator 62 has the microscope model 48 and the sample model 50. In reality, the first simulator 46 and the second simulator 62 are in substance the same program. In FIG. 2, in order to clearly show the two-stage simulation, the first simulator 46 and the second simulator 62 are represented separately.

The second simulator 62 executes a simulation based on the microscope model 48 and the sample model 50 according to a simulation condition, to thereby generate a calculated Ronchigram. In reality, the second simulator 62 sequentially generates a plurality of calculated Ronchigrams according to a plurality of sets of in-advance simulation conditions which are sequentially input. During this process, one or a plurality of parameters in the sample model 50 are set at random, as necessary.

The post-processor 64 applies a post-processing on each of the generated calculated Ronchigrams. As the post-processing, there may be exemplified a first post-processing to correct the image quality at random, and a second post-processing which is a masking process. In the first post-processing, brightness of each pixel is corrected at random within a designated range, and an image contrast is corrected at random within a designated range. During this process, the brightness of each pixel may be corrected at random, assuming a brightness distribution which is generated at random. Reference numeral 65 shows designation of the brightness correction range and the contrast correction range. When the brightness and the contrast are corrected at random, a random number generator 64A is used. With the correction of the brightness and the contrast, it becomes possible to generate the calculated Ronchigram which is closer to the actual Ronchigram.

In the second post-processing, the masking process is applied to each individual calculated Ronchigram as necessary. That is, in the calculated Ronchigram, a process is applied to cover and deactivate a periphery of the center portion having a circular shape while exposing the center portion. When the actual Ronchigram is acquired, normally, a focusing diaphragm is used. In this case, a circular actual Ronchigram is acquired. In the masking process, a process is applied corresponding to the diaphragm for the calculated Ronchigram. Alternatively, the user may choose whether or not to apply the second post-processing. Alternatively, a diameter of the center portion may be set at random, within a certain range. According to the masking process, a directional dependency in the estimation model can be resolved or reduced.

Alternatively, the two post-processings executed by the post-processor 64 may be executed inside the second simulator 62. Alternatively, a post-processor having a function similar to that of the post-processor 64 may be provided in the first module 12A, downstream of the first simulator 46.

The learner 69 is formed from the CNN. Alternatively, other types of learners may be used. The learner 69 includes an estimation model, and sequentially executes machine learning according to a plurality of sets of training data 66 which are sequentially input. With the progress of the machine learning, the estimation model is gradually improved. Each individual set of training data 66 is formed from an aberration value set 67 included in the simulation condition, and a calculated Ronchigram 68 generated based on the simulation condition and on which necessary post-processings are applied. The aberration value set 67 is a correct answer aberration value set, and data thereof are correct answer data. The structure of the correct answer aberration value set is identical to the structure of the aberration value set which is estimated.

When the calculated Ronchigram is supplied to the estimation mode, the estimation model is updated so that the estimation result of the estimation model becomes closer to the correct answer aberration value set. By repeating this process, the estimation model is gradually improved. Finally, a learned estimation model (actual model) for estimating the aberration value set is generated in the learner 69. The learned estimation model is transferred to the electron microscope (refer to reference numeral 42).

As described, according to the machine learning sub-system according to the present embodiment, calculated Ronchigrams of a wide variety and in a large number can be easily generated by the simulator. The calculated Ronchigrams are close to a large number of actual Ronchigrams which are actually acquired. By executing the machine learning of the estimation model using these calculated Ronchigrams, a learned estimation model which can execute highly precise estimation can be constructed. In the machine learning sub-system according to the present embodiment, a part of the aberration values, more specifically, the group of intrinsic aberration values, is estimated with high precision in advance, and a simulation condition can be set including these aberration values as fixed values. With such a configuration, the calculated Ronchigram can be made closer to the actual Ronchigram.

Figure 3:
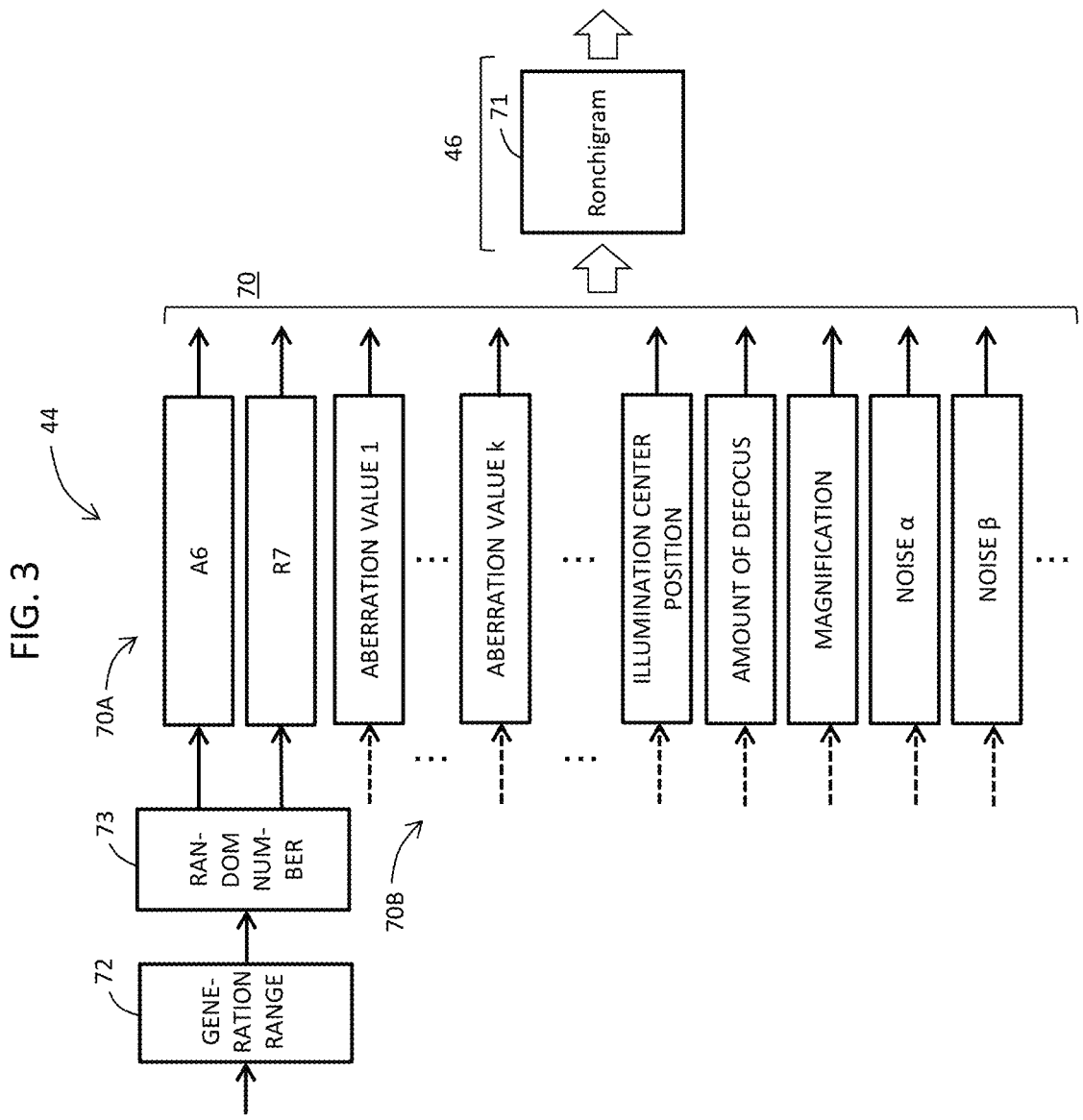
FIG. 3 is a conceptual diagram showing an in-advance simulation process.

FIG. 3 exemplifies an in-advance simulation condition 70 which is set by the first condition setter 44. The in-advance simulation condition 70 is formed from a plurality of parameters necessary when a calculated Ronchigram 71 is generated by the first simulator 46. In the illustrated example configuration, specifically, the in-advance simulation condition 70 includes the aberration value A6, the aberration value R7, k aberration values including aberration values 1~k, the illumination center position (illumination center coordinate), the amount of defocus, the magnification, a noise $\alpha$, a noise $\beta$, and the like. The aberration values included in the in-advance simulation condition 70 are hypothetical aberration values for the simulation. The value of the parameter k is, for example, 14.

Of the in-advance simulation condition 70, for the aberration value A6 and the aberration value R7, an occurrence range is individually designated in advance (refer to reference numeral 72), and the aberration value A6 and the aberration value R7 are generated using random numbers within the occurrence ranges (refer to reference numeral 73). In the in-advance simulation condition 70, the aberration value A6 and the aberration value R7 form a variable portion 70A, and the plurality of other parameters form a fixed portion 70B.

The aberration values 1~k include the two-fold astigmatism value, the second-order coma aberration value, the three-fold astigmatism value, the third-order spherical aberration value, the third-order star aberration value, and the like. These aberration values are aberration values of lower orders than the aberration value A6 and the aberration value R7. For example, 0 may be designated for the aberration values 1~k, or standard values or average values in the past may be assigned for these aberration values. The illumination center position may be set as an origin, and the magnification may be set at a standard value. The noise $\alpha$ and the noise $\beta$ may be set at zero or average values. The noise $\alpha$ and the noise $\beta$ will be described later. For example, a standard value may be assigned as the amount of defocus. The amount of defocus may be transferred to the movable portion 70A, and other parameters may be additionally transferred to the movable portion 70A.

Figure 4:
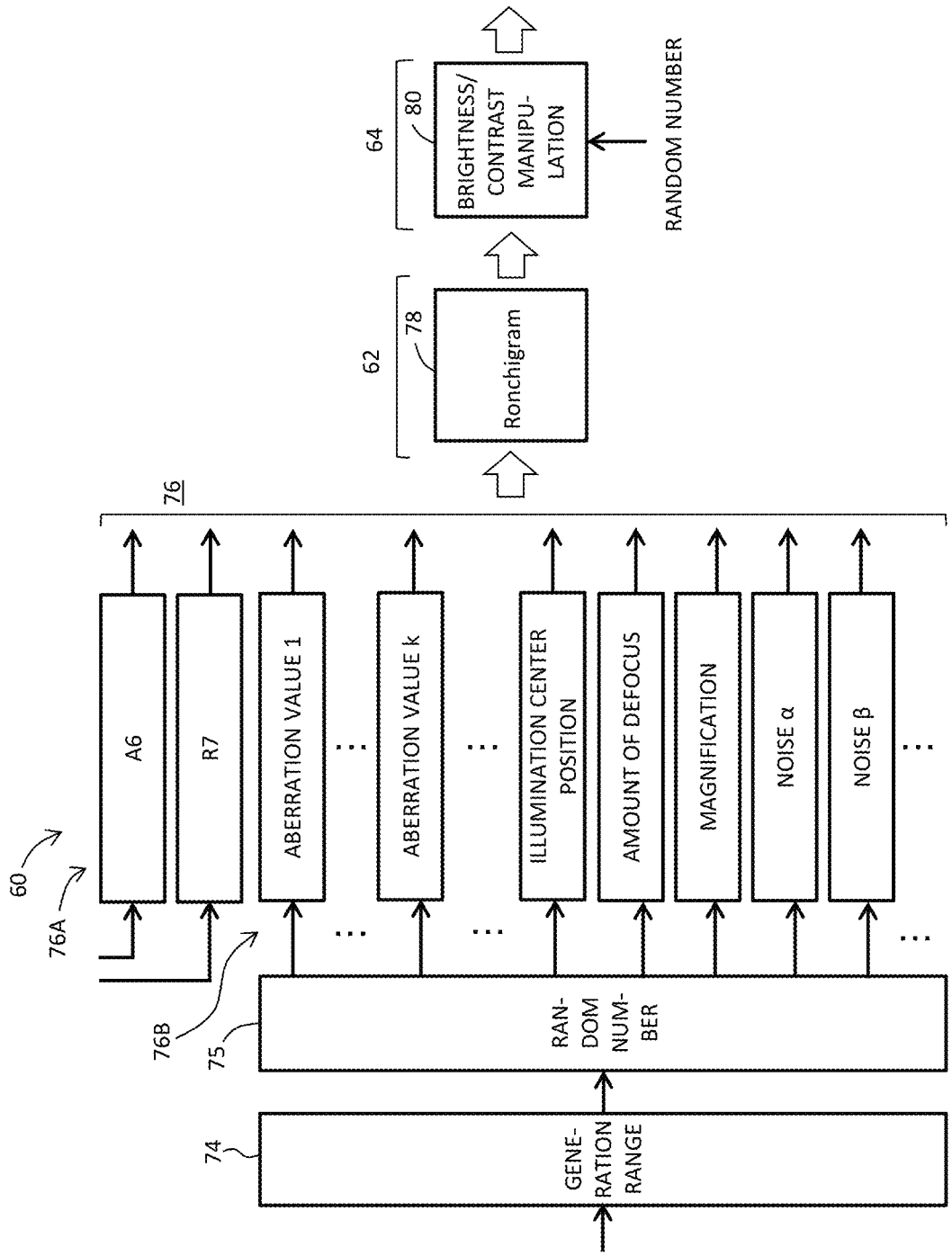
FIG. 4 is a conceptual diagram showing a simulation process.

FIG. 4 exemplifies a simulation condition 76 which is set by the second condition setter 60. The simulation condition 76 is formed from a plurality of parameters necessary when a calculated Ronchigram 78 is generated at the second simulator 62. In the illustrated example configuration, specifically, the simulation condition 76 includes the aberration value A6, the aberration value R7, the aberration values 1~k, the illumination center position, the amount of defocus, the magnification, the noise $\alpha$, the noise $\beta$, and the like. The aberration values included in the simulation condition 76 are hypothetical aberration values for the simulation. The structure of the simulation condition 76 is basically identical to the structure of the in-advance simulation condition.

Of the simulation condition 76, the aberration value A6 and the aberration value R7 are fixed. That is, these aberration values form a fixed portion 76A. These aberration values are already estimated with high precision. Thus, by fixing these aberration values, the calculated Ronchigram 78 can be made closer to the actual Ronchigram. The remaining parameters form a variable portion 76B.

For each of the parameters of the variable portion 76B, an occurrence range therefor is determined in advance (refer to reference numeral 74), and the parameters are generated at random based on random numbers within the occurrence ranges (refer to reference numeral 75). Here, the noise a is a shot noise which occurs due to illumination of the electron beam, and is a noise which inevitably mixes to the camera image. The noise β is a noise which occurs when a detection data array is read from the CCD. Alternatively, other noises may be additionally taken into consideration. The simulation condition also includes an accelerating voltage. Normally, the accelerating voltage when the Ronchigram is acquired is designated, but alternatively, the accelerating voltage may be variable. This is similarly true for the in-advance simulation condition.

A post-processing is applied by the post-processor 64 on the calculated Ronchigram 78 generated by the simulator 62. The post-processing includes random brightness correction and random contrast correction on the calculated Ronchigram 78 (refer to reference numeral 80). In these processes, random numbers are used. In the post-processor 64, the masking process is also applied to the calculated Ronchigram 78 as necessary.

Figure 5:
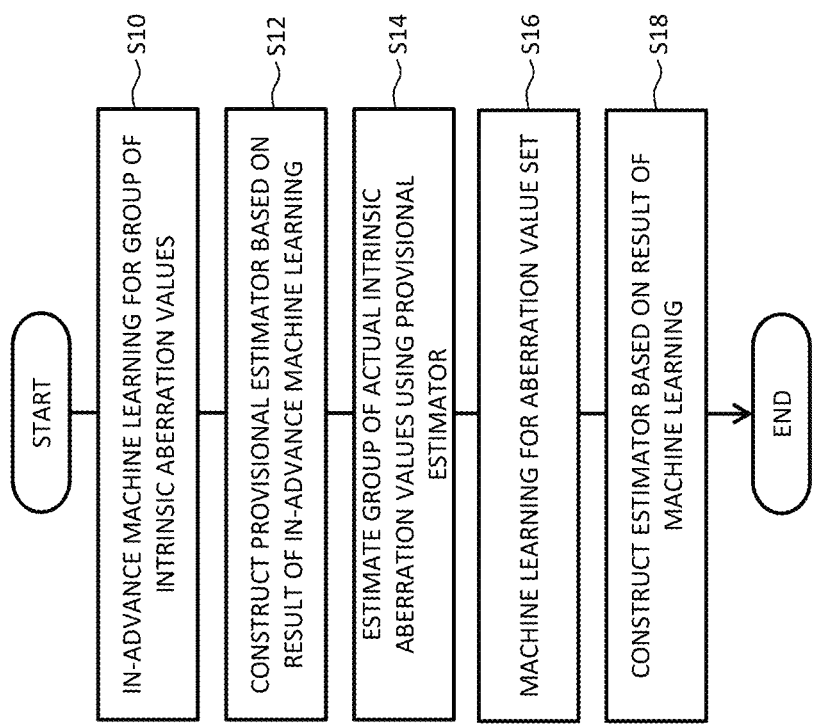
FIG. 5 is a flowchart showing a method of generating an estimation model according to an embodiment of the present disclosure.

FIG. 5 shows the machine learning method according to the present embodiment as a flowchart. In S10, the in-advance machine learning is executed for the group of intrinsic aberration values. In the present embodiment, the group of intrinsic aberration values are formed from the aberration value A6 and the aberration value R7. Alternatively, the in-advance machine learning and the in-advance estimation may be executed for one of the aberration values A6 and R7. S10 includes the in-advance simulation process and the in-advance learning process.

In S12, the learned estimation model (provisional model) is generated in the provisional learner as a result of the in-advance learning. The learned estimation model may be transferred to the provisional estimator. However, because the provisional learner and the provisional estimator are the same in substance, at the completion of the in-advance learning, the provisional learner may be used as the provisional estimator.

In S14, the actual Ronchigram is input to the provisional estimator, to estimate the group of actual aberration values. In the present embodiment, the actual aberration value A6 and the actual aberration value R7 are estimated. In the acquisition of the actual Ronchigram used in S14, the operation of the aberration corrector is adjusted so that the aberrations other than the six-fold astigmatism and the sixth-order three-lobe aberration (aberrations of lower orders than the six-fold astigmatism and the sixth-order three-lobe aberration) are minimized.

In S16, the machine learning is executed for the aberration value set. Specifically, similar to S10 described above, S16 includes the simulation process and the learning process. A learned estimation model (actual model) is formed as a result of the machine learning in S16, and is transferred to the electron microscope. With this process, in S18, an aberration value estimator is constructed as an actual estimator.

Figure 6:
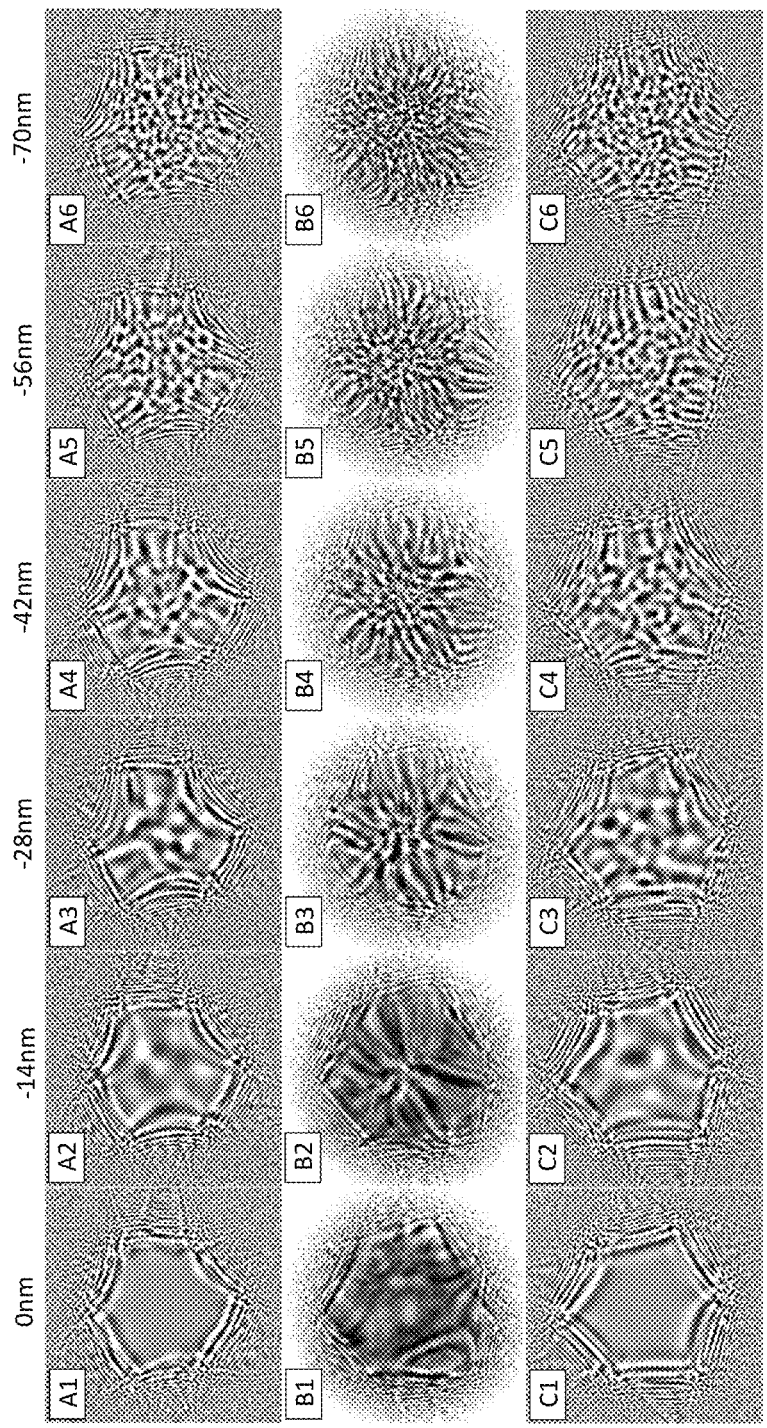
FIG. 6 is a diagram showing an array of calculated Ronchigrams in a comparative example, an array of actual Ronchigrams, and an array of calculated Ronchigrams according to an embodiment of the present disclosure.

FIG. 6 shows at an upper part an array of calculated Ronchigrams according to a comparative example (refer to A1~A6). FIG. 6 also shows at a middle part an array of actual Ronchigrams acquired by the electron microscope (refer to B1~B6), and at a lower part an array of calculated Ronchigrams according to the present embodiment (refer to C1~C6). In FIG. 6, numerical values shown at the uppermost part indicate the amount of defocus.

In the comparative example, as the aberration value A6 and the aberration value R7 included in the simulation condition, values predicted by an experimenter are designated. As the simulation condition, no other aberration is presumed.

The array of actual Ronchigrams are those acquired by the electron microscope after minimizing the aberration. Because the six-fold astigmatism and the sixth-order three-lobe aberration cannot be corrected, these aberrations are reflected in the Ronchigram as residual aberrations.

The array of calculated Ronchigrams according to the present embodiment are aberration values generated by the second simulator after the aberration value A6 and the aberration value R7 are estimated. The simulation condition includes the aberration value A6 and the aberration value R7 which are estimated with high precision. As the simulation condition, no other aberration value is presumed.

The array of calculated Ronchigrams according to the comparative example have a large number of portions which do not reproduce the array of actual Ronchigrams. For example, when a hexagon positioned at the center in the calculated Ronchigram A1 according to the comparative example and a hexagon positioned at the center in the actual Ronchigram B1 are compared, a significant difference can be found. On the other hand, when a hexagon positioned at the center of the calculated Ronchigram C1 according to the present embodiment and the hexagon positioned at the center of the actual Ronchigram B1 are compared, a similarity can be found. A similar trend may be found when the three results are compared for other amounts of defocus.

By executing the machine learning of the estimation model using the calculated Ronchigram close to the actual Ronchigram, the learned estimation model can be further improved. With this configuration, reliability of the estimated aberration value set can be improved.

Figure 7:
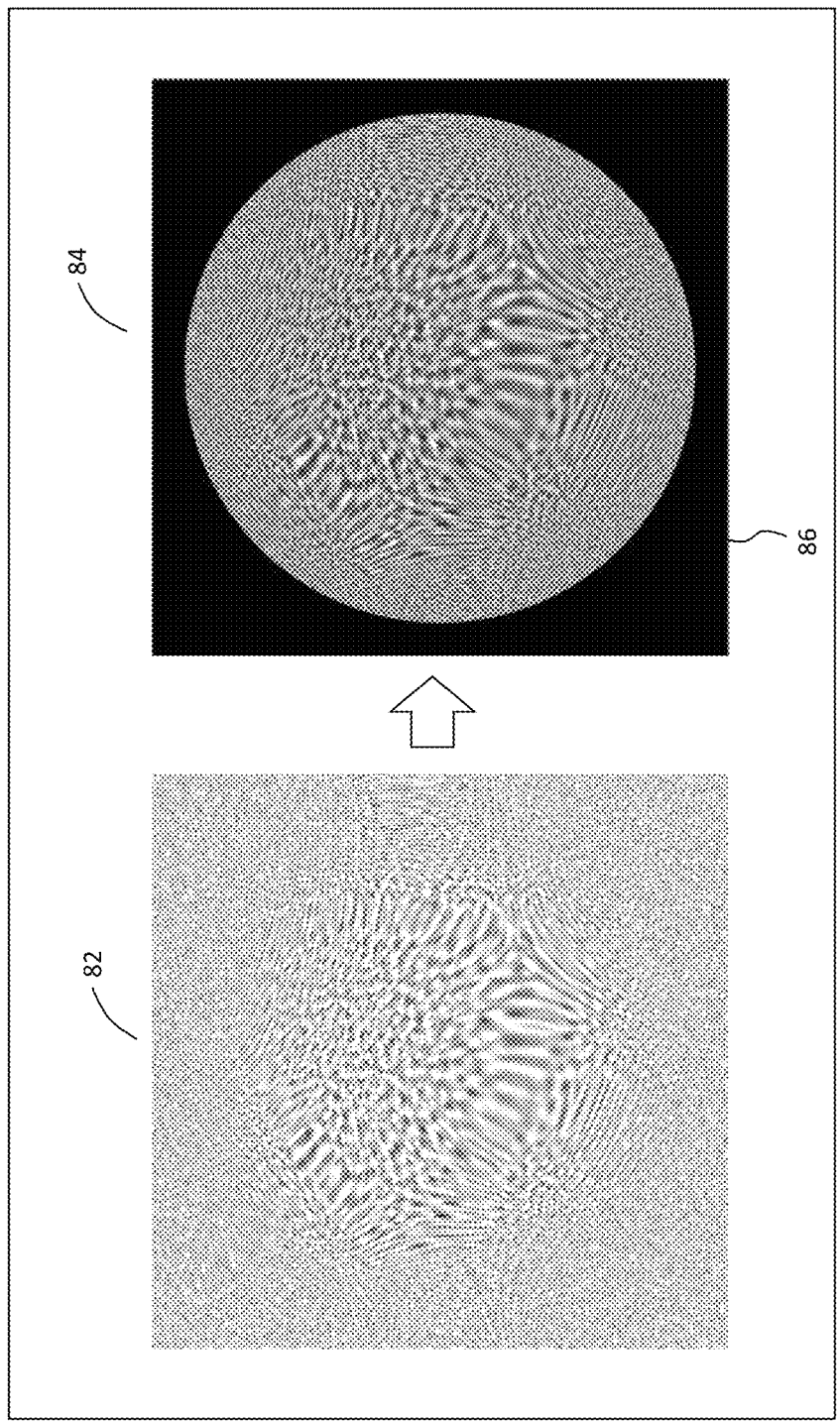
FIG. 7 is a diagram showing an example of a mask.

FIG. 7 exemplifies at a left side a calculated Ronchigram 82, and at a right side a calculated Ronchigram 84 after the masking process is applied. A mask 86 has a form covering a periphery while exposing a circular region at the center. By supplying the calculated Ronchigram after the masking process to the estimator, the problem of anisotropy, in which the estimation results vary depending on the direction of modeling, can be avoided. Normally, the actual Ronchigram is acquired with a focusing diaphragm. Thus, the masking process may be considered to be a natural process, modeling the action of the focusing diaphragm.

Figure 8:
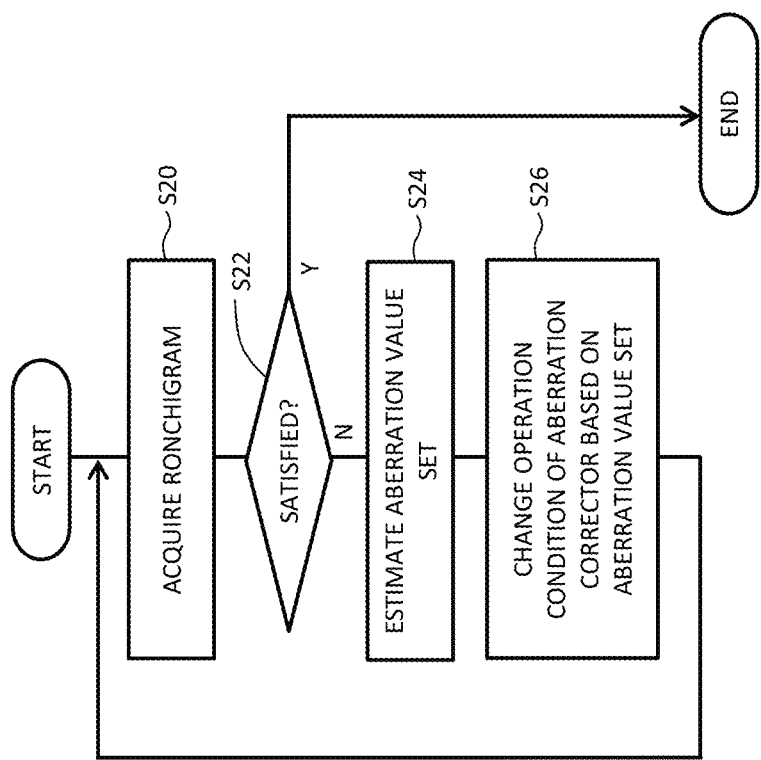
FIG. 8 is a flowchart showing aberration correction according to an embodiment of the present disclosure.

FIG. 8 shows a method of correcting aberration according to the present embodiment as a flowchart. In S20, the actual Ronchigram is acquired by the electron microscope. In S22, it is judged whether or not a result of the aberration correction satisfies an appropriateness condition based on the actual Ronchigram. Alternatively, the appropriateness of the result of the aberration correction may be judged based on the aberration value set estimated based on the actual Ronchigram.

When the appropriateness condition is not satisfied in S22, in S24, the actual Ronchigram is supplied to the learned estimation model, and the aberration value set is estimated. In S26, an operation condition of the aberration corrector is changed based on the estimated aberration value set. Then, the processes from S20 are repeatedly executed.

Figure 9:
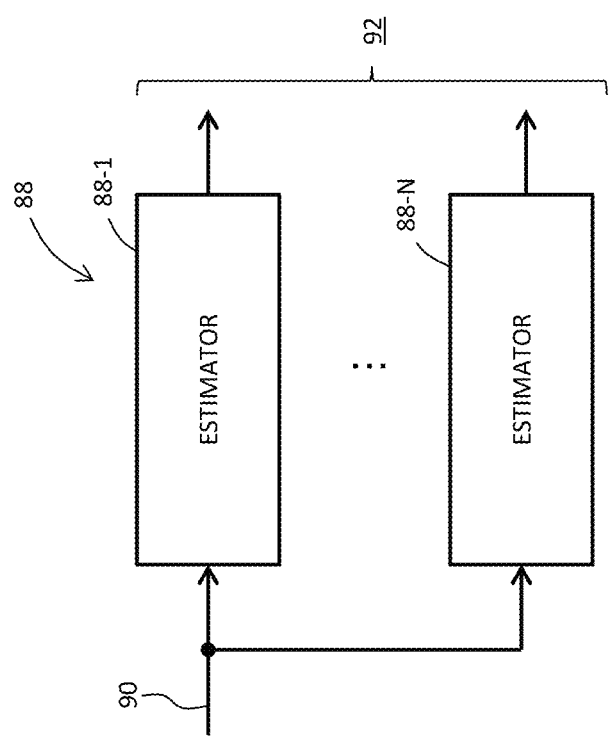
FIG. 9 is a block diagram showing a structure of an aberration value estimator according to an alternative configuration of the present disclosure.

FIG. 9 shows an alternative configuration of the aberration value estimator. An aberration value estimator 88 is formed from N estimators 88-1~88N which are placed in parallel to each other. Here, N is an integer greater than or equal to 2. An actual Ronchigram 90 is input to the plurality of estimators 88-1~88-N in parallel to each other, and N aberration values are output in parallel to each other from the N estimators 88-1~88-N. These aberration values form an aberration value set 92, which is sent to the aberration correction controller.

Figure 10:
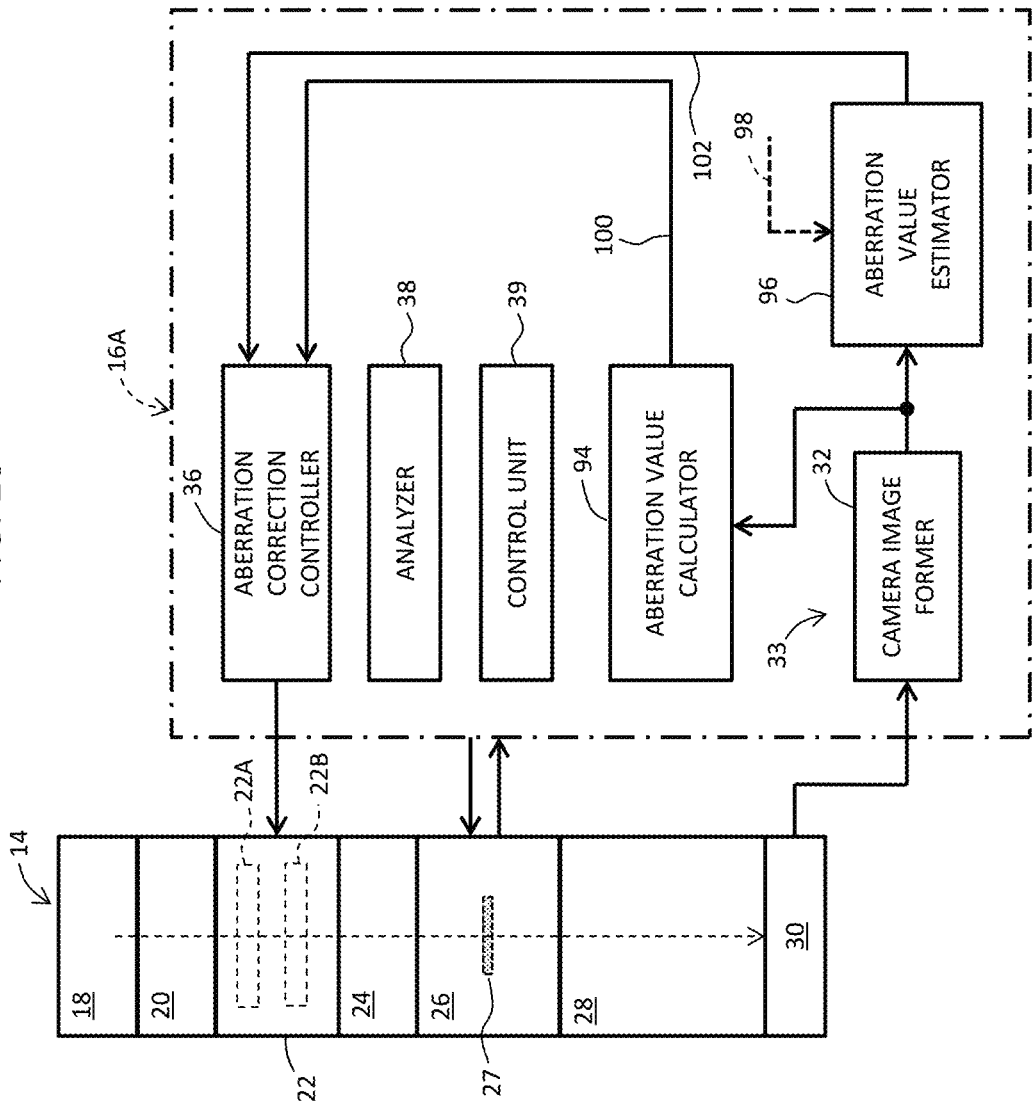
FIG. 10 is a block diagram showing an electron microscope system according to an alternative configuration of the present disclosure.

FIG. 10 shows an alternative configuration of the electron microscope system. In FIG. 10, elements similar to those of FIG. 1 are assigned the same reference numerals, and will not be repeatedly described.

In a calculation control apparatus 16A, an aberration value calculator 94 is a calculator which calculates a first aberration value set 100 by analyzing an electron microscope image through a predetermined algorithm. For this process, for example, the SRAM method described above is used. When the method is executed, a plurality of regions are set for each of a first actual Ronchigram and a second actual Ronchigram, and a self-correlation function is calculated for each region. Based on a plurality of self-correlation functions calculated based on the first actual Ronchigram and a plurality of self-correlation functions calculated based on the second actual Ronchigram, the first aberration value set 100 is calculated. Alternatively, one first aberration value may be calculated by the aberration value calculator 94.

An aberration value estimator 96 has a learned estimation model. The learned estimation model is generated by a machine learning sub-system, and is installed to the aberration value estimator 96 (refer to reference numeral 98). The aberration value estimator 96 generates a second aberration value set 102 based on the first actual Ronchigram or the second actual Ronchigram. Alternatively, one aberration value may be estimated by the aberration value estimator 96. The first aberration value set 100 and the second aberration value set 102 form an aberration value set which is referred to by the aberration correction controller 36.

According to the configuration shown in FIG. 10, advantages provided by the aberration value calculation based on the algorithm and the advantages provided by the aberration value estimation using the learned estimation model can both be taken advantage of, and disadvantages of the methods can be covered. For example, when a certain aberration value is caused having low estimation precision in the aberration value calculator 94, the certain aberration value may be estimated by the aberration value estimator 96.

When a vector is output from the aberration value estimator as the aberration value, the vector may be represented in an orthogonal coordinate system in place of a polar coordinate system. That is, the orthogonal coordinate system may be employed in the generation of the estimation model. When such a configuration is employed, a coordinate converter may be provided downstream of the aberration value estimator. The coordinate converter converts the coordinate system from the orthogonal coordinate system to the polar coordinate system.

The invention claimed is:

1. A method of generating an estimation model, the method comprising:
    generating a plurality of calculated Ronchigrams by repeatedly executing a simulation while changing a simulation condition; and
    improving an estimation model in a learner by sequentially supplying, to the learner, a plurality of sets of training data formed from the plurality of calculated Ronchigrams and a plurality of sets of correct answer data corresponding to the plurality of calculated Ronchigrams, wherein
    the estimation model is a model for estimating one or a plurality of aberration values which are referred to in aberration correction in an electron microscope, and
    each set of correct answer data is data indicating one or a plurality of hypothetical aberration values included in each simulation condition.

2. The method of generating the estimation model according to claim 1, wherein
    each simulation condition comprises a hypothetical aberration value set, a hypothetical amount of defocus, a hypothetical illumination center position, and a hypothetical magnification.

3. The method of generating the estimation model according to claim 1, the method further comprising:
    estimating in advance a particular aberration value based on an actual Ronchigram, wherein
    in the generating the plurality of calculated Ronchigrams, the simulation is executed based on a hypothetical aberration value set comprising the particular aberration value.

4. The method of generating the estimation model according to claim 3, wherein
    the particular aberration value is an aberration value for a particular aberration which occurs due to an aberration corrector of the electron microscope, and which cannot be corrected by the aberration corrector.

5. The method of generating the estimation model according to claim 4, wherein
    the particular aberration is an aberration of an order which is higher than those of one or a plurality of aberrations which are estimation targets.

6. The method of generating the estimation model according to claim 3, wherein
    the estimating in advance the particular aberration value comprises:
        generating a plurality of calculated Ronchigrams by repeatedly executing an in-advance simulation while changing an in-advance simulation condition;
        improving an in-advance estimation model in an in-advance learner by sequentially supplying, to the in-advance learner, a plurality of sets of in-advance training data formed from the plurality of calculated Ronchigrams which are generated, and a plurality of sets of correct answer data corresponding to the plurality of calculated Ronchigrams; and
        estimating the particular aberration value by supplying the actual Ronchigram to an in-advance estimator having the in-advance estimation model, and
    the set of correct answer data in each set of in-advance training data is data indicating a hypothetical intrinsic aberration value included in each in-advance simulation condition.

7. The method of generating the estimation model according to claim 1, the method further comprising:
    applying a post-processing on the plurality of calculated Ronchigrams which are generated, wherein
    each set of training data comprises a calculated Ronchigram to which the post-processing is applied.

8. The method of generating the estimation model according to claim 7, wherein
    the post-processing comprises a masking process in which a periphery of each calculated Ronchigram is covered while exposing a center portion of the calculated Ronchigram.

* * * * *